United States Patent
Fusumada et al.

(10) Patent No.: US 7,730,374 B2
(45) Date of Patent: Jun. 1, 2010

(54) SELF TEST CIRCUIT FOR A SEMICONDUCTOR INTERGRATED CIRCUIT

(75) Inventors: Massahiro Fusumada, Kodaira (JP); Hitoshi Saitoh, Kawasaki (JP); Shinji Togashi, Tokyo (JP); Akira Yano, Kawaguchi (JP)

(73) Assignee: Texas Instruments Incorporated, Dallas, TX (US)

( * ) Notice: Subject to any disclaimer, the term of this patent is extended or adjusted under 35 U.S.C. 154(b) by 701 days.

(21) Appl. No.: 11/555,524

(22) Filed: Nov. 1, 2006

(65) Prior Publication Data

US 2007/0118784 A1    May 24, 2007

(30) Foreign Application Priority Data

Nov. 1, 2005    (JP) .............................. 2005-318923

(51) Int. Cl.
*G01R 31/28* (2006.01)
(52) U.S. Cl. ...................... 714/733; 714/700
(58) Field of Classification Search ................ 365/233; 326/41; 327/726, 159; 714/731, 709, 733, 714/700
See application file for complete search history.

(56) References Cited

U.S. PATENT DOCUMENTS

| | | | |
|---|---|---|---|
| 6,661,266 B1 | 12/2003 | Variyam et al. | |
| 7,138,829 B1 * | 11/2006 | Dalvi | ........................ 326/41 |
| 7,246,286 B2 * | 7/2007 | Hsieh | ........................ 714/731 |
| 7,315,968 B2 * | 1/2008 | Nakamura et al. | .......... 714/709 |
| 7,548,105 B2 * | 6/2009 | Shrank et al. | ................ 327/276 |
| 2001/0009530 A1 * | 7/2001 | Maeda | ........................ 365/233 |

* cited by examiner

*Primary Examiner*—David Ton
(74) *Attorney, Agent, or Firm*—William B. Kempler; Wade J. Brady, III; Frederick J. Telecky, Jr.

(57) ABSTRACT

A semiconductor integrated circuit that self-tests the skew margin of the clock and data signals in an LVDS. A clock signal CKB1 is held in flip-flop circuit 105 synchronously with checking clock signal A1. Checking pattern signal PAT_A is held in flip-flop circuit 104 synchronously with checking clock signal A2. When the skew margin of clock signal CKA_IN and data signal DA_IN are checked, the checking signal TCKA of flip-flop circuit 105 is input instead of clock signal CKA_IN, and the checking signal TDA of flip-flop circuit 104 is input instead of clock signal DA_IN. The timing relationship between clock signal CKB7 and checking timing signal A1 and the timing relationship between clock signal CKB7 and checking timing signal A2 are controlled independently by timing control circuit 109.

19 Claims, 10 Drawing Sheets

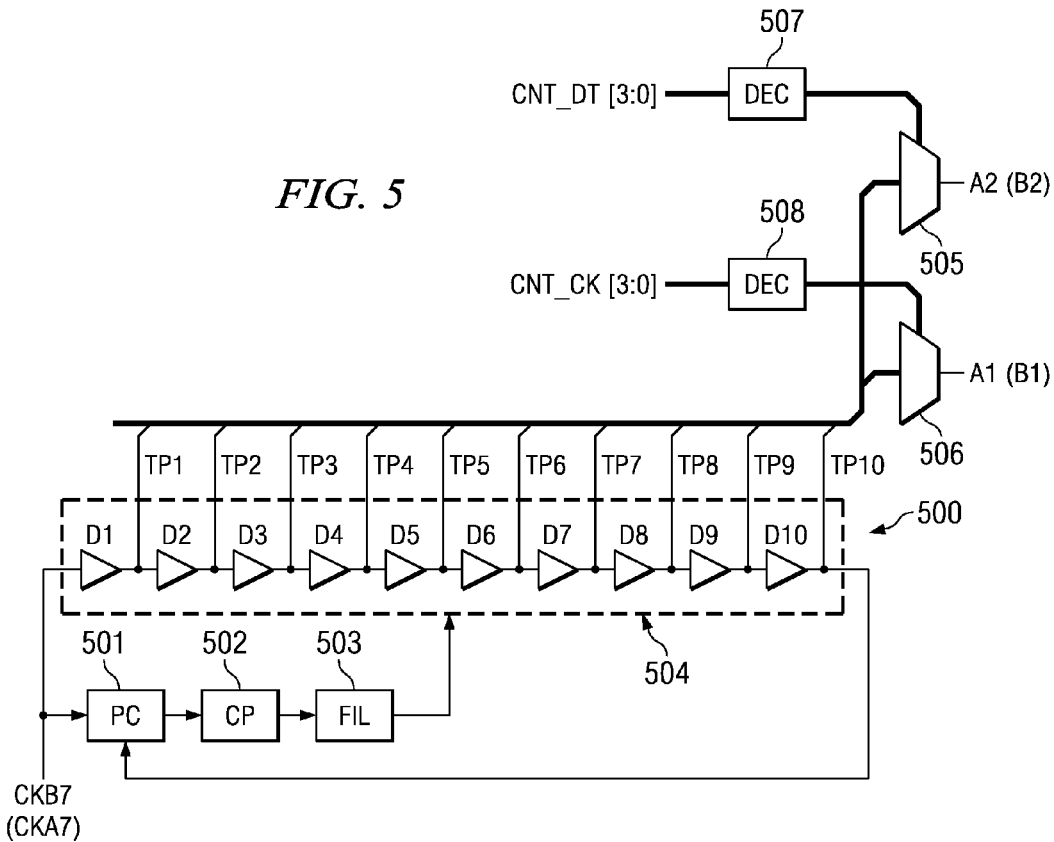
FIG. 5
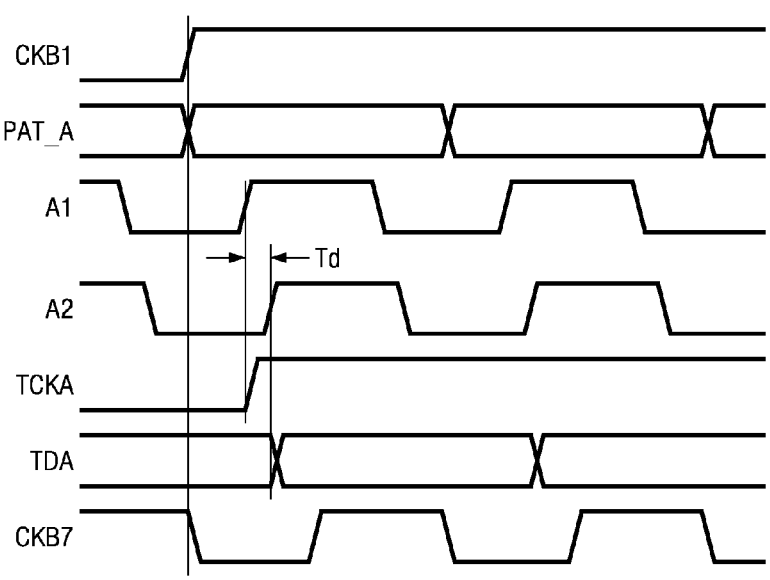
FIG. 6A  CKB1
FIG. 6B  PAT_A
FIG. 6C  A1
FIG. 6D  A2
FIG. 6E  TCKA
FIG. 6F  TDA
FIG. 6G  CKB7

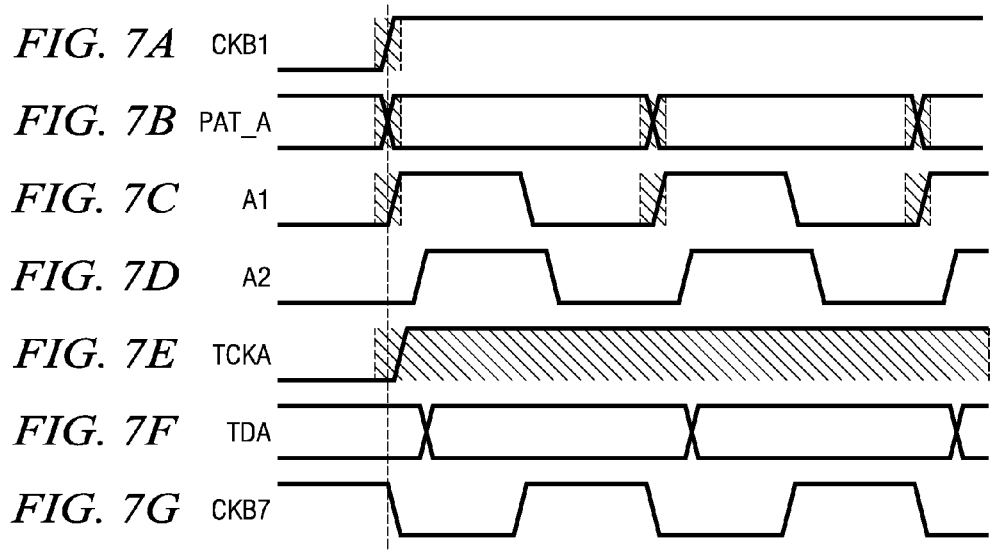
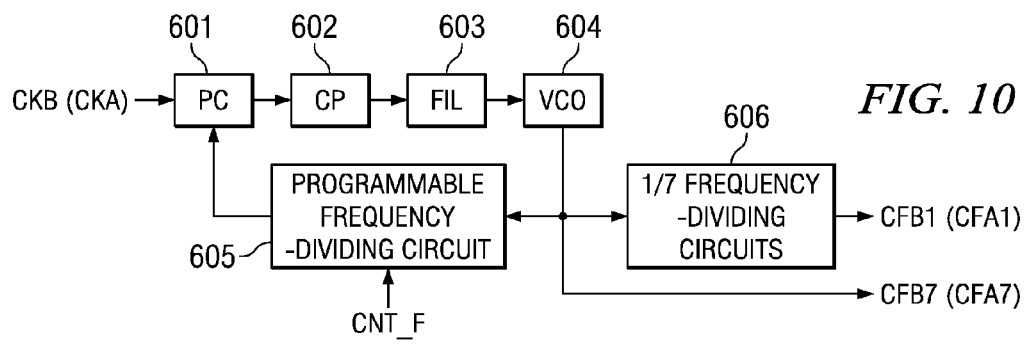
FIG. 10
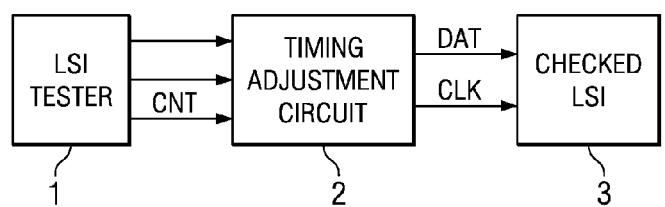
FIG. 12

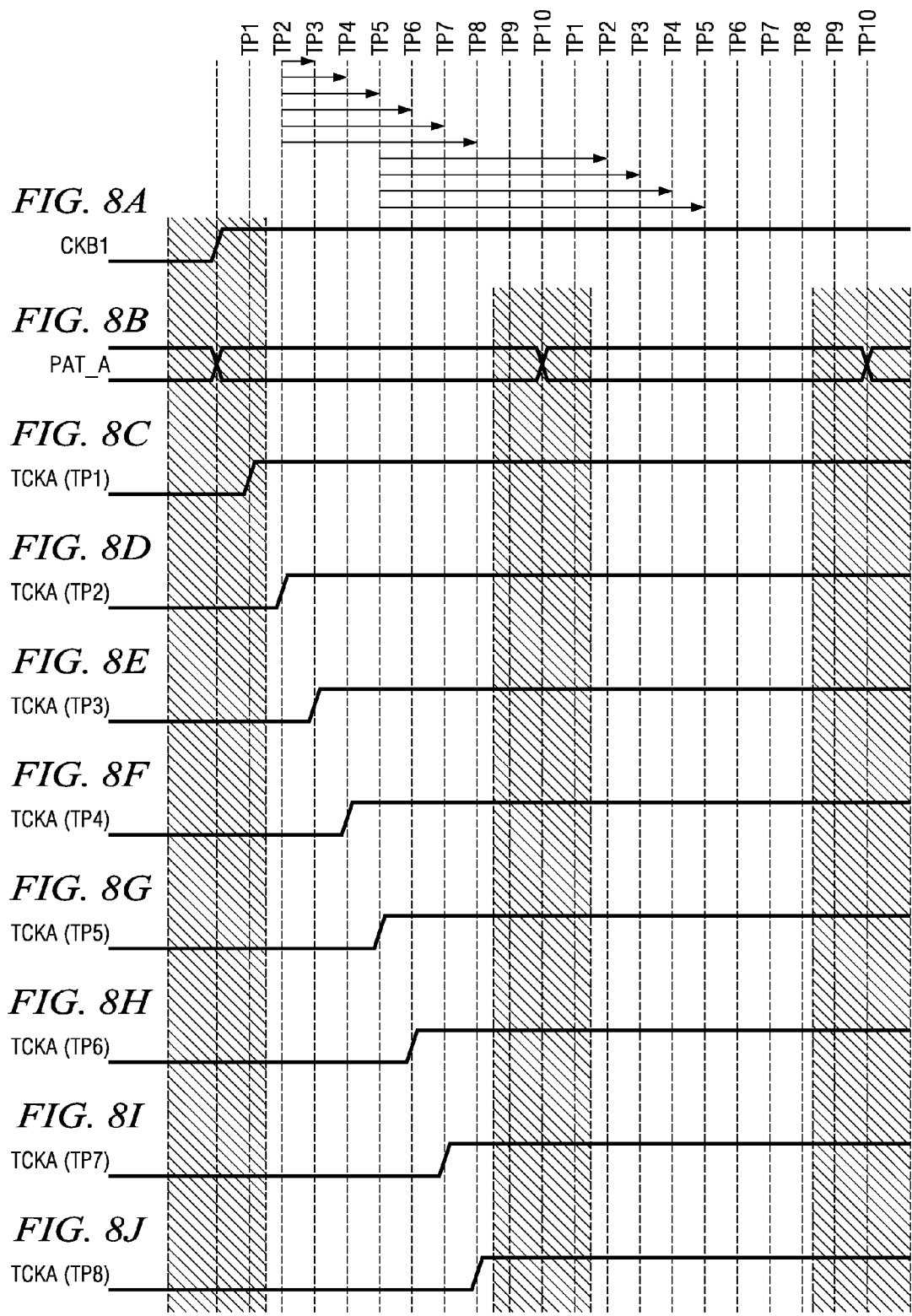

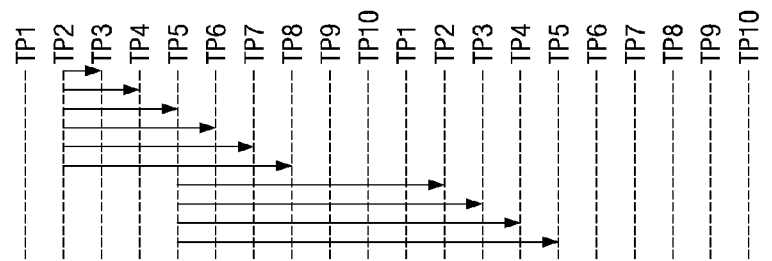

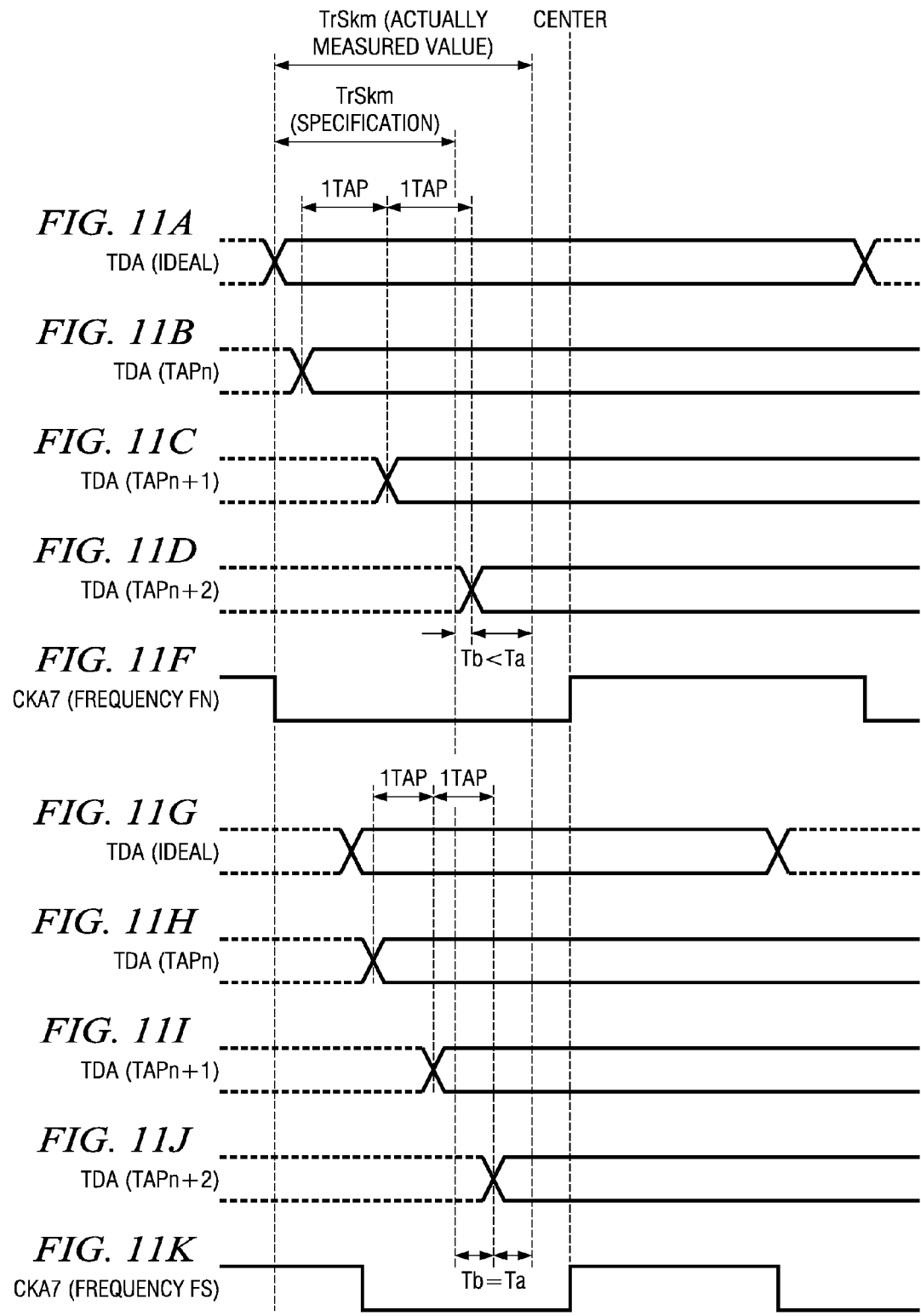

SELF TEST CIRCUIT FOR A SEMICONDUCTOR INTERGRATED CIRCUIT

FIELD OF THE INVENTION

The present invention pertains to a semiconductor integrated circuit having a checking circuit used for self-checking (self-test) the circuit operation.

BACKGROUND OF THE INVENTION

In general, in a semiconductor integrated circuit that processes input data synchronously with clock signal, it is necessary for the internal flip-flop circuits or other memory elements to keep the input data at the high level or the low level during the period around the time when the input data are input. If the input data changes during that period, the data input to the memory elements become unstable, and the normal circuit operation cannot take place.

The time of confirming the input data before they are input is known as the setup time, and the time of holding the input data after the input is known as the hold time.

FIG. 12 shows an example of a checking device used for checking the setup time and the hold time of an LSI.

In checked LSI 3, checking data DAT and clock signal CLK are supplied from LSI tester 1 via timing adjustment circuit 2. Timing adjustment circuit 2 precisely adjusts the phase relationship between data DAT and clock signal CLK corresponding to a control signal CNT supplied from LSI tester 1. Timing adjustment circuit 2 is arranged close to semiconductor integrated circuit 3 so that the delay occurring in the signal path between LSI tester 1 and checked LSI 3 will not generate errors during the test.

LSI tester 1 checks the response of checked LSI 3 while the phase relationship between data DAT and clock signal CLK is being precisely adjusted to determine whether the setup time and the hold time of checked circuit LSI 3 satisfy prescribed specifications.

On the other hand, the operating speed of semiconductor integrated circuits have steadily increased. For example, in the high-speed differential transmission system known as LVDS (low voltage differential signaling), it is required that the skew of the clock and data signals be restrained to about several hundred psec.

When conducting an AC test on high-speed signals such as LVDS, it is necessary to adjust the timing of the signal with a high resolution, such as 100 psec or lower. However, it is very difficult to guarantee the test accuracy to such a high resolution with current high-speed LSI testers. Even if such a test can be realized, since the test system is easily affected, it is difficult to conduct stable production line tests, etc. Also, since high-speed testers are usually expensive, the manufacturing cost will be increased.

Consequently, the method known as BIST (built-in self test), which conducts the test that was formerly conducted by LSI testers or other external devices with a special circuit inside the semiconductor integrated circuit, has become popular (for example, see patent reference 1). Since the influence of signal delay can be avoided inside the semiconductor integrated, high-speed signals can be processed more accurately than with an external device.

[Patent reference 1] Japanese Kokai Patent Application No. 2002-6003

However, as the signal speed is increased as in LVDS, the delay characteristic tends to vary for each individual circuit due to variations in manufacturing conditions and other factors even if the circuit is inside the semiconductor integrated circuit. Consequently, it is desired to adjust the timing of the input signal used as the object to be inspected over a wide range when checking the setup time and hold time. Also, since the checking circuit built into the semiconductor integrated circuit makes no contribution to the main operation, its configuration should be as simple as possible.

A general object of the present invention is to provide a semiconductor integrated circuit, which can self-check the circuit operation pertaining to the timing relationship between plurality of input signals and can adjust the timing of the input signals used as object to be inspected over a wide range with a simple configuration.

SUMMARY OF THE INVENTION

This and other objects and features are attained in accordance with one aspect view of the present invention by a semiconductor integrated circuit having a checking circuit that can self-check the circuit operation corresponding to the timing relationship between a first input signal and at least one second input signal, comprising a checking signal output circuit that outputs a first checking signal and a second checking signal synchronously with an input clock signal; a first flip-flop circuit that holds the aforementioned first checking signal synchronously with a first checking clock signal; a second flip-flop circuit that holds the aforementioned second checking signal synchronously with a second checking clock signal; a checking signal input circuit that inputs the checking signal held in the aforementioned first flip-flop circuit instead of the aforementioned first input signal and the checking signal held in the aforementioned second flip-flop circuit instead of the aforementioned second input signal when performing the aforementioned self-checking; and a timing control circuit that controls the timing relationship between the first checking clock signal and the input clock signal corresponding to a first control signal and the timing relationship between the second checking clock signal and the input clock signal corresponding to a second control signal.

The semiconductor integrated circuit on the basis of the first point of view may comprise a plurality of checking circuits. When said self-checking is performed in one checking circuit, the first input signal as the object to be inspected in another checking circuit or a signal synchronized with the input signal is supplied as the aforementioned input clock signal to said one checking circuit.

The semiconductor integrated circuit can also have a plurality of phase-locked loop circuits corresponding to the aforementioned plurality of checking circuits. Each phase-locked loop circuit generates a first clock signal synchronously with the first input signal as the object to be inspected in the corresponding checking circuit and a second clock signal that multiples the frequency of the first clock signal. When said self-checking is performed in one checking circuit, the checking signal output circuit included in said one checking circuit outputs the aforementioned first and second checking signals synchronously with the first clock signal generated in the phase-locked loop circuit corresponding to another checking circuit. The timing control circuit included in said one checking circuit outputs the second clock signal generated in the phase-locked loop circuit corresponding to said another checking circuit as the aforementioned first checking clock signal and delays the second clock signal corresponding to the aforementioned second control signal and then outputs it as the aforementioned second checking clock signal.

Also, the aforementioned timing control circuit can include a delay synchronization loop circuit that outputs a plurality of delay signals, each of which has a prescribed phase difference with respect to the aforementioned second clock signal, a first selection circuit that outputs a delay signal selected corresponding to the aforementioned first control signal from the aforementioned plurality of delay signals as the aforementioned first checking clock signal, and a second selection circuit that outputs a delay signal selected corresponding to the aforementioned second control signal from the aforementioned plurality of delay signals as the aforementioned second checking clock signal.

The aforementioned checking circuit can also comprise a frequency control circuit that controls the frequency of the aforementioned input clock signal corresponding to a control signal.

The aforementioned semiconductor integrated circuit can also comprise a circuit block that outputs a signal corresponding to the aforementioned first and second input signals and a judging circuit that determines whether the operation of the aforementioned circuit block is normal on the basis of the output signal of the aforementioned circuit block corresponding to the checking signal input by the aforementioned checking signal input circuit instead of the aforementioned first and second input signals.

A second aspect of the present invention is a semiconductor integrated circuit characterized by the fact that the semiconductor integrated circuit comprises the following: a first memory circuit that inputs and outputs a first data signal corresponding to a first clock signal, a second memory circuit that inputs and outputs a second data signal corresponding to a second clock signal, a first test signal generating circuit that generates first and second test signals corresponding to the aforementioned second clock signal, a first timing signal generating circuit that generates first and second timing signals corresponding to the aforementioned second clock signal, a third memory circuit that inputs a first test signal corresponding to the aforementioned first timing signal and outputs it as a first test data signal, a fourth memory circuit that inputs a second test signal corresponding to the aforementioned second timing signal and outputs it as a first test clock signal, a second test signal generating circuit that generates third and fourth test signals corresponding to the aforementioned first clock signal, a second timing signal generating circuit that generates third and fourth timing signals corresponding to the aforementioned first clock signal, a fifth memory circuit that inputs the aforementioned third test signal corresponding to the aforementioned third timing signal and outputs it as a second test data signal, a sixth memory circuit that inputs the aforementioned fourth test signal corresponding to the aforementioned fourth timing signal and outputs it as a second test clock signal, a first test signal input circuit that supplies the aforementioned first test data signal to the aforementioned first memory circuit, a second test signal input circuit that supplies the aforementioned second test clock signal to the aforementioned first memory circuit, a third test signal input circuit that supplies the aforementioned second test data signal to the aforementioned second memory circuit, a fourth test signal input circuit that supplies the aforementioned second test clock signal to the aforementioned second memory circuit; the aforementioned first memory circuit is tested on the basis of the aforementioned second clock signal, and the aforementioned second memory circuit is tested on the basis of the aforementioned first clock signal.

This semiconductor integrated circuit can also comprise a first input circuit that inputs a first external data signal and outputs it as the aforementioned first data signal, a second input circuit that inputs a first external clock signal, a first PLL circuit that is electrically connected to the aforementioned second input circuit and outputs a third clock signal with the same frequency as the aforementioned first external clock signal and the aforementioned first clock signal having a higher frequency than the third clock signal, a third input circuit that inputs a second external data signal and outputs it as the aforementioned second data signal, a fourth input circuit that inputs a second external clock signal, a second PLL circuit that is electrically connected to the aforementioned fourth input circuit and outputs a fourth clock signal having the same frequency as the aforementioned second external clock signal and the aforementioned second clock signal having higher frequency than the fourth clock signal. In this case, the aforementioned second test signal is the aforementioned fourth clock signal, and the aforementioned fourth test signal is the aforementioned third clock signal.

The aforementioned first test signal generating circuit can include a first pattern generating circuit used for generating test data, and the aforementioned second test signal generating circuit can include a second pattern generating circuit used for generating test data.

The aforementioned first and second timing signals can have different phases, and the aforementioned third and fourth timing signals can have different phases.

BRIEF DESCRIPTION OF THE DRAWINGS

FIG. 5 shows an example of the configuration of the timing control circuit;

FIGS. 6A-6G show the timing relationship of the signals of each part when the skew margin is checked;

FIGS. 7A-7G show an example of the case when the flip-flop circuits in the checking circuit hold signals during a period when the signal holding operation is inhibited;

FIGS. 8A-8T show an example of avoiding the period in which the signal holding operation of the flip-flop circuits is inhibited, and adjusting the skew margin of two checking signals input instead of the input signals over one period;

FIG. 10 shows a configuration example of the PLL circuit used as frequency control circuit;

FIGS. 11A-11D and 11F-11K is a diagram explaining an example that can set the checking threshold value appropriately by changing the frequency of the clock signal; and FIG. 12 shows an example of the checking device used for checking the setup time and the hold time of an LSI.

REFERENCE NUMERALS AND SYMBOLS AS SHOWN IN THE DRAWINGS

In the FIGS. 301 302, 311, 312 represent differential receiver circuits, 111, 211, 303, 313 represent PLL circuits, 103, 203, 305, 315 represent serial/parallel conversion circuits, 300 represents a digital circuit, 100, 200 represent checking circuits, 101, 201 represent checking signal output circuits, 104,105, 204, 205 represent flip-flop circuits, 106, 206 represent checking signal input circuits, 109, 209 represent timing control circuits, 110, 210 represent judging circuits, 500 represents a delay-locked loop circuit, 505, 506 represent selection circuits, 507, 508 represent decoding circuits.

DESCRIPTION OF THE EMBODIMENTS

According to the present invention, it is possible to self-check the circuit operation pertaining to the timing relationship between a plurality of input signals. Also, it is possible to adjust the timing of the input signals as object to be inspected over a wide range with a simple configuration.

Figure 1A:
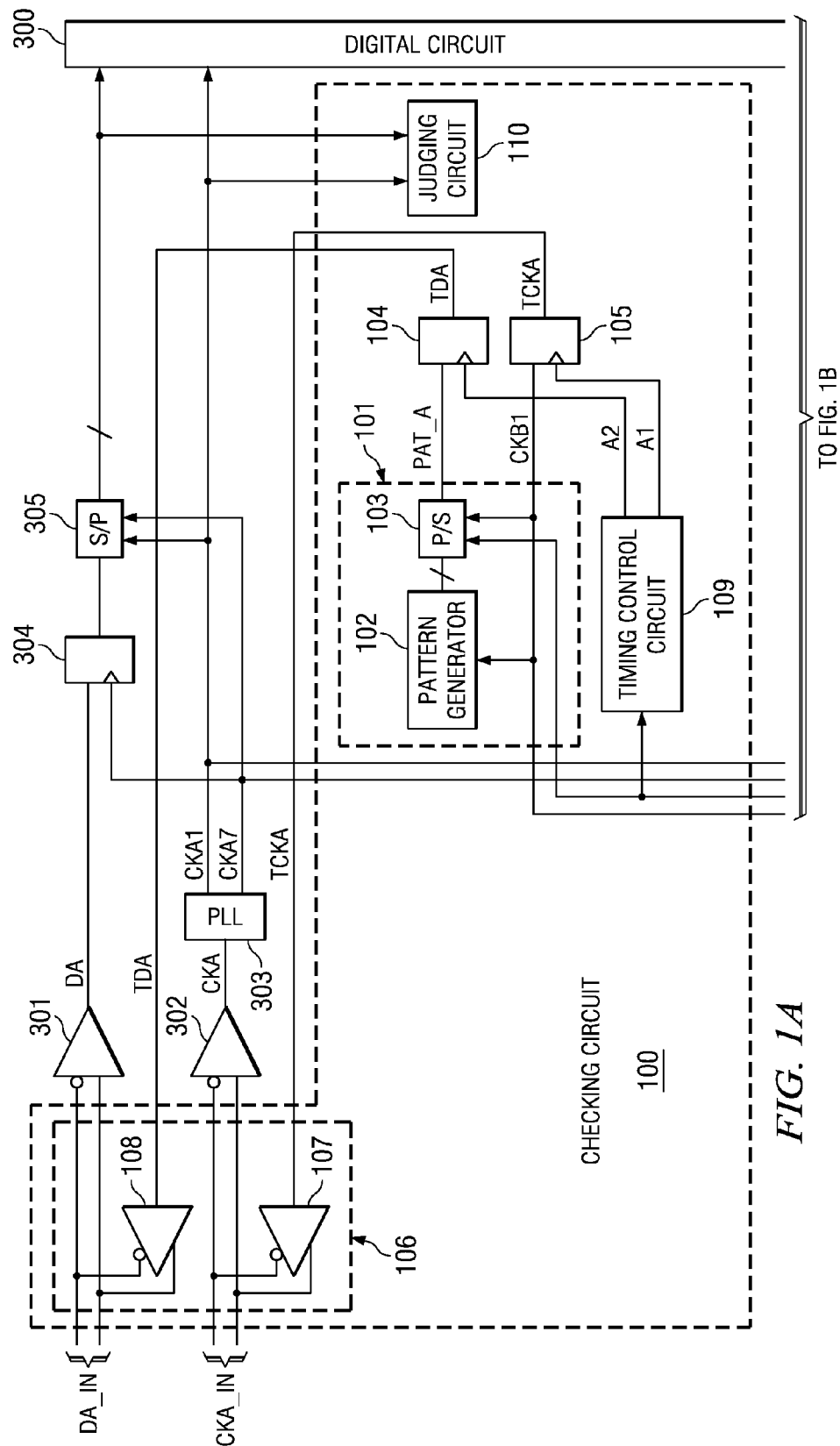
FIGS. 1A and 1B show an example of the configuration of the semiconductor integrated circuit disclosed in an embodiment of the present invention.
Figure 1B:
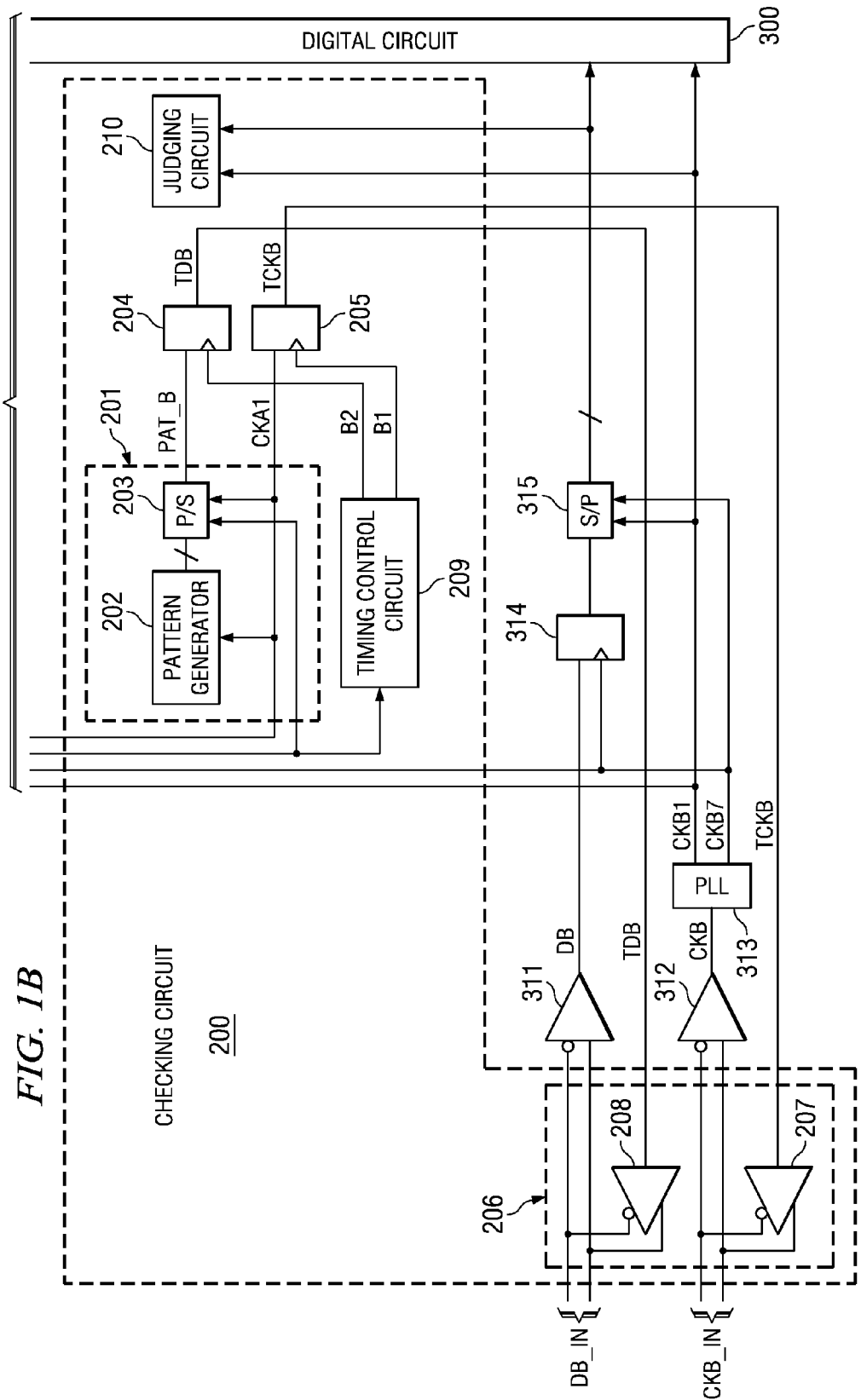

FIG. 1 shows an example of the configuration of the semiconductor integrated circuit disclosed in an embodiment of the present invention.

The semiconductor integrated circuit shown in FIG. 1 has differential receiver circuits 301, 302, 311, 312, phase-locked loop circuits (referred to as PLL circuit hereinafter) 303, 313, flip-flop circuits 304, 314, serial/parallel conversion circuits 305, 315, digital circuit 300, checking circuits 100, 200.

Checking circuit 100 includes checking signal output circuit 101, flip-flop circuits 104,105, checking signal input circuit 106, timing control circuit 109, judging circuit 110.

Checking circuit 200 includes checking signal output circuit 201, flip-flop circuits 204, 205, checking signal input circuit 206, timing control circuit 209, judging circuit 210.

Checking circuits 100, 200 are an embodiment of the checking circuit disclosed in the present invention.

Checking signal output circuits 101, 201 are an embodiment of the checking signal output circuit in the present invention.

Flip-flop circuits 105, 205 are an embodiment of the first flip-flop circuit in the present invention.

Flip-flop circuits 104, 204 are an embodiment of the second flip-flop circuit in the present invention.

Checking signal input circuits 106, 206 are an embodiment of the checking signal input circuit in the present invention.

Timing control circuit 109, 209 are an embodiment of the timing control circuit in the present invention.

PLL circuits 303, 313 are an embodiment of the PLL circuit in the present invention.

Judging circuits 110, 210 are an embodiment of the judging circuit in the present invention.

Differential receiver circuit 301 receives data signal DA_IN transmitted as a differential signal and converts it into single-level data signal DA.

Differential receiver circuit 302 receives data signal CKA_IN transmitted as a differential signal and converts it into single-level data signal CKA.

Differential receiver circuit 311 receives data signal DB_IN transmitted as a differential signal and converts it into single-level data signal DB.

Differential receiver circuit 312 receives data signal CKB_IN transmitted as a differential signal and converts it into single-level data signal CKB.

Differential receiver circuits 301, 302, 311, 312 receive low-amplitude differential signals transmitted at high speed by the LVDS system and convert them into single-level signals.

PLL circuit 303 outputs clock signals CKA1 and CKA7 synchronously with clock signal CKA output from differential receiver circuit 302. PLL circuit 303 increases the frequency of clock signal CKA7 to seven times the frequency of clock signal CKA1.

PLL circuit 313 outputs clock signals CKB1 and CKB7 synchronously with clock signal CKB output from differential receiver circuit 312. PLL circuit 313 increases the frequency of clock signal CKB7 to seven times the frequency of clock signal CKB1.

Figure 2:
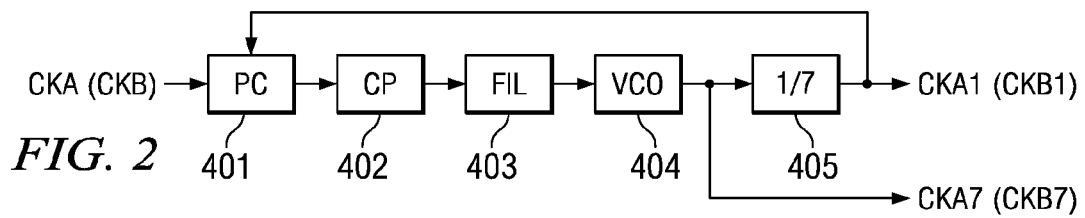
FIG. 2 shows an example of the configuration of the PLL circuit.

FIG. 2 shows an example of the configuration of PLL circuits 303, 313.

PLL circuits 303, 313 shown in FIG. 2 have phase comparing circuit 401, charge-pump circuit 402, filter circuit 403, voltage-controlled oscillator 404, frequency-dividing circuit 405.

In FIG. 2, the symbols indicating the input/output signals of PLL circuit 313 are appended in parentheses after the codes indicating the input/output signals of PLL circuit 303.

Clock signal CKA (CKB) and the signal whose frequency is divided into frequency-dividing circuit 405 are input to phase comparing circuit 401, which compares the phases of the two input signals.

Charge-pump circuit 402 charges or discharges a capacitor (not shown in the figure) corresponding to the comparison result of phase comparing circuit 401 so that the negative feedback control is activated to reduce the phase difference between the two input signals.

Filter circuit 403 is, for example, a low-pass filter circuit that adjusts the transfer characteristic of the negative feedback loop. It supplies the low-frequency component of the voltage generated in the capacitor of charge-pump circuit 402 to voltage-controlled oscillator 404.

Voltage controller oscillator 404 oscillates at a frequency corresponding to the voltage supplied from filter circuit 403.

Frequency-dividing circuit 405 divides the frequency of the oscillation signal of voltage-controlled oscillator 404 by $1/7$ and feeds the signal back to phase comparing circuit 401. The input signal of frequency-dividing circuit 405 is clock signal CKA7 (CKB7), and the output signal becomes clock signal CKA1 (CKB1).

By using PLL circuit 303 (313) shown in FIG. 2, negative feedback control is performed so that the phase of clock signal CKA1 (CKB1) as the output signal of frequency-dividing circuit 405 becomes consistent with the phase of clock signal CKA (CKB). Consequently, clock signal CKA1 (CKB1) is synchronized with clock signal CKA (CKB), and the two signals have almost the same frequency. Also, clock signal CKA7 (CKB7) has a frequency 7 times that of clock signal CKA1 (CKB1).

FIG. 2 was explained above.

Now, let's return to FIG. 1.

Flip-flop circuit 304 holds data signal DA output from differential receiver 301 synchronously with clock signal CKA7 and outputs it to serial/parallel conversion circuit 305 in the next stage.

Serial/parallel conversion circuit 305 converts the 1-bit data held in flip-flop circuit 304 into 7-bit data synchronously with clock signal CKA1.

Flip-flop circuit 314 holds data signal DB output from differential receiver 311 synchronously with clock signal CKB7 and outputs it to serial/parallel conversion circuit 315 in the next stage.

Serial/parallel conversion circuit 315 converts the 1-bit data held in flip-flop circuit 314 into 7-bit data synchronously with clock signal CKB1.

Digital circuit 300 performs a prescribed operation on the 7-bit data input from serial/parallel conversion circuits 305 and 315. In this embodiment, there is no particular limitation on the function of digital circuit 300.

Checking circuit 100 self-checks the circuit operation corresponding to the timing relationship between clock signal CKA_IN and data signal DA_IN. In other words, it checks whether the skew margin Trskm (to be explained below) of clock signal CKA_IN and data signal DA_IN satisfies the prescribed specification.

Checking circuit 200 self-checks the circuit operation corresponding to the timing relationship between clock signal CKB_IN and data signal DB_IN. In other words, it checks whether the skew margin Trskm (to be explained below) of clock signal CKB_IN and data signal DB_IN satisfies the prescribed specification.

The timing relationship between clock signal CKA_IN and data signal DA_IN and the skew margin Trskm will be explained on the basis of FIGS. 3 and 4.

Figure 3:
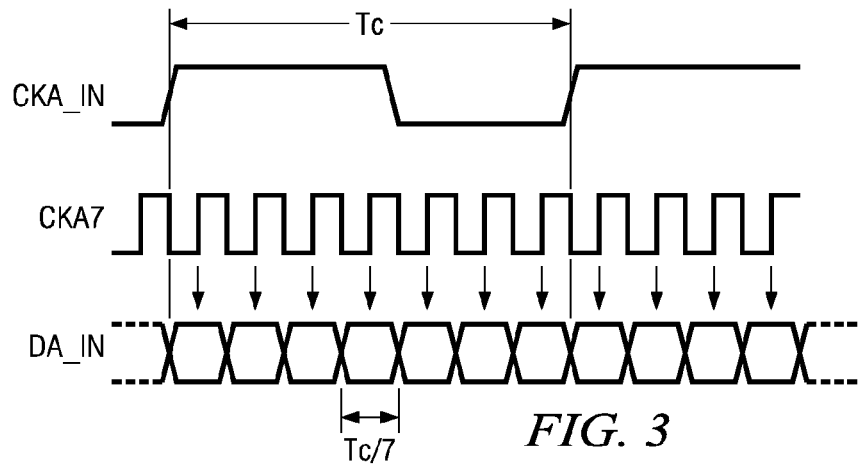
FIG. 3 shows an example of the timing relationship between the clock signal and the data signal.

FIG. 3 shows an example of the timing relationship between clock signal CKA_IN and data signal DA_IN.

The period Tc of clock signal CKA_IN (FIG. 3(A)) is set to be 7 times one data period of data signal DA_IN (FIG. 3(C)). When the frequency of clock signal CKA_IN is increased by 7 times by PLL circuit 303, clock signal CKA7 (FIG. 3(B)) used for inputting data signal DA_IN is obtained.

Figure 4:
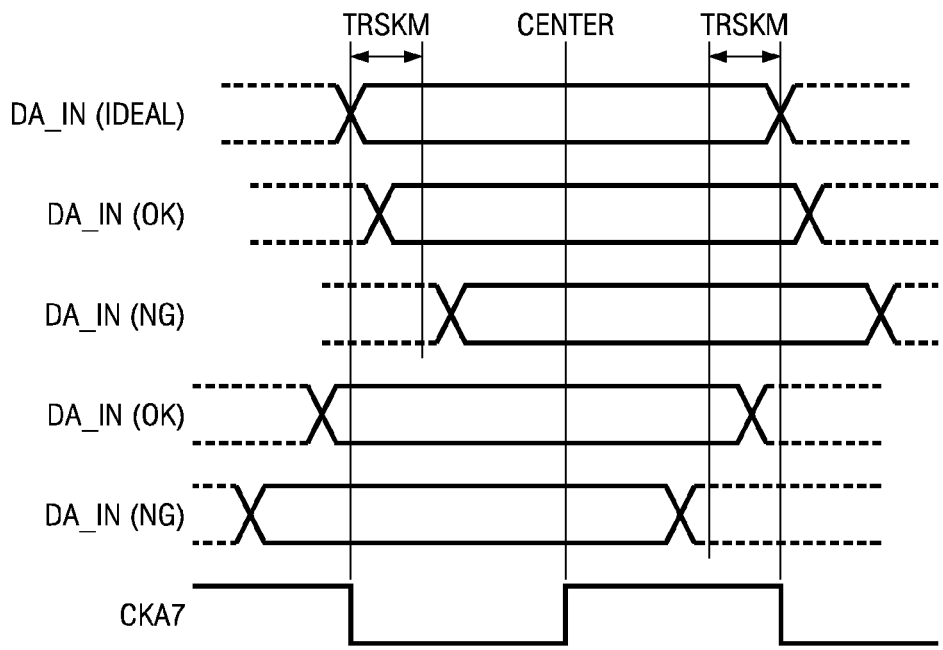
FIG. 4 is a diagram explaining the skew margin.

FIG. 4 is a diagram explaining skew margin Trskm.

The central point of one data period of data signal DA_IN is the most ideal timing of inputting data signal DA_IN synchronously with clock signal CKA7. This is because the central point is the point farthest away temporally from the front and back data variation points, and the signal level is stabilized at the maximum level or minimum level. Skew margin Trskm represents the allowable range of the time deviation with respect to the ideal data input timing.

FIG. 4(A) shows the case when data signal DA_IN is in the most ideal timing relationship with respect to clock signal CKA7 (FIG. 4(F)). Since flip-flop circuit 304 holds data signal DA synchronously with the rise of clock signal CKA7, an ideal timing relationship is obtained in the case of FIG. 4(A), in which the rise of clock signal CKA7 is consistent with the center of DA1 data period.

FIGS. 4(B), (C) show the cases when data signal DA_IN is delayed with respect to the timing of FIG. 4(A). If the delay is less than skew margin Trskm (FIG. 4(B)), data signal DA is normally held in flip-flop circuit 304. On the other hand, if the delay of data signal DA_IN exceeds skew margin Trskm (FIG. 4(C)), the operation of flip-flop circuit 304 becomes unstable, and data signal DA cannot be held stably.

FIGS. 4(D), (E) show the cases when clock signal CKA7 is delayed with respect to the timing of FIG. 4(A). If this delay is less than skew margin Trskm (FIG. 4(D)), data signal DA is held normally in flip-flop circuit 304. If the delay of clock signal CAK7 exceeds skew margin Trskm (FIG. 4(E)), the operation of flip-flop circuit 304 becomes unstable, and data signal DA cannot be held stably.

The timing relationship between clock signal CKA_IN and data signal DA_IN and skew margin Trskm were explained above. The timing relationship between clock signal CKB_IN and data signal DB_IN and skew margin Trskm are the same as described above.

In the following, each constituent element of checking circuit 100 will be explained.

Checking signal output circuit 101 outputs checking pattern signal PAT-A (second checking signal) and clock signal CKB1 (first checking signal) synchronously with clock signals CKB1, CKB7 generated by PLL circuit 313.

In the example shown in FIG. 1, checking signal output circuit 101 performs no processing at all on clock signal CKB1. In this embodiment, however, the first and second checking signals output from checking signal output circuit 101 are signals synchronized with clock signals CKB1, CKB7. As an example, the checking signal can also be the same as clock signal CKB1 synchronously with clock signal CKB7. Therefore, in this case, clock signal CKB1 is explained as the first checking signal output from checking signal output circuit 101.

Checking signal output circuit 101 includes pattern generator 102 and parallel/serial conversion circuit 103 in the example shown in FIG. 1.

Pattern generator 102 generates a checking pattern signal for simulating data signal DA_IN. Pattern generator 102 generates a 7-bit checking pattern signal synchronously with clock signal CKB1.

Parallel/serial conversion circuit 103 converts the 7-bit checking pattern signal generated by pattern generator 102 into 1-bit checking pattern signal PAT_A synchronously with clock signal CKB7.

Flip-flop circuit 105 holds clock signal CKB1 (first checking signal) output from checking signal output circuit 101 synchronously with checking clock signal A1 output from timing control circuit 109.

Flip-flop circuit 104 holds checking pattern signal PAT_A (second checking signal) output from checking signal output circuit 101 synchronously with checking clock signal A2 output from timing control circuit 109.

When the skew margin Trskm of data signal DA_IN and clock signal CKA_IN is checked, checking signal input circuit 106 converts the checking signal TCKA held in flip-flop circuit 105 into a differential signal and inputs it into differential receiver circuit 302 instead of clock signal CKA_IN. It also converts checking signal TDA held in flip-flop circuit 104 into a differential signal and inputs it into differential receiver circuit 301 instead of data signal DA_IN.

Checking signal input circuit 106 has differential transmitter circuits 107 and 108 in the example shown in FIG. 1.

Differential transmitter circuit 107 converts the signal held in flip-flop circuit 105 into a differential signal of LVDS type, etc. and inputs it into differential receiver circuit 302.

Differential transmitter circuit 108 converts the signal held in flip-flop circuit 104 into a differential signal of LVDS type, etc. and inputs it into differential receiver circuit 301.

For differential transmitter circuits 107, 108, the outputs can also be set in the high impedance state during normal operation without performing self-checking.

Timing control circuit 109 independently controls the timing relationship between clock signal CKB7 and checking clock signal A1 and the timing relationship between clock signal CKB7 and checking clock signal A2 corresponding to the control sent from a control circuit (not shown in the figure).

In this case, as an example, checking clock signals A1, A2 and clock signal CKB7 have the same frequency. In this case, timing control circuit 109 can use the delay-locked loop circuit shown in FIG. 5 to control the phase difference between clock signal CKB7 and checking clock signal A1 and the phase difference between clock signal CKB7 and checking clock signal A2.

FIG. 5 shows an example of the configuration of timing control circuit 109.

The timing control circuit 109 shown in FIG. 5 comprises delay-locked loop circuit (referred to as DLL hereinafter) 500, selection circuits 505, 506, decoding circuits 507, 508. The DLL circuit has phase comparing circuit 501, charge-pump circuit 502, filter circuit 503, and delay circuit 504 having delay elements D1-D10 connected in series.

In FIG. 5, symbols representing the input/output signals of timing control circuit 209 (which will be discussed below) are appended in parentheses after the symbols representing the input/output signals of timing control circuit 109.

Delay signal TP10 output from the delay element D10 of delay circuit 504 and clock signal CKB7 are input to phase comparing circuit 501, which compares the phase of the two input signals.

Charge-pump circuit 502 charges or discharges a capacitor (not shown in the figure) corresponding to the comparison result of phase comparing circuit 501 so that the negative feedback control is activated to reduce the phase difference between the two input signals.

Filter circuit 503 is, for example, a low-pass filter circuit that adjusts the transfer characteristic of the negative feedback loop. It supplies the low-frequency component of the voltage generated in the capacitor of charge-pump circuit 502 to delay circuit 504.

Delay circuit 504 delays and outputs the input clock signal CKB7 corresponding to the voltage from filter circuit 403. Clock signal CKB7 is transferred through each delay element from the initial stage (delay element D1) of delay elements D1-D10 connected in series in the order "D1, D2, D3, ..., D10". Delay elements D1-D10 output delayed signals TP1-TP10, respectively.

By using DLL circuit 500, since negative feedback control is performed so that clock signal CKB7 is in phase with delay signal TP10, delay signal TP10 has a delay of about one period with respect to clock signal CKB7. Also, if delay elements D1-D10 have the same delay characteristics, a delay of about 1/10 of the period of clock signal CKB7 is generated by each delay element. The delay of each delayed signal with respect to clock signal CKB7 increases in the order "TP1, TP2, ..., TP10".

Decoding circuit 508 decodes the 4-bit control signal CNT_CK supplied from a control circuit (not shown in the figure) and supplies the decoded signal to selection circuit 506.

Selection circuit 506 selects one delayed signal from 10 delayed signals TP1-TP10 generated by DLL circuit 500 corresponding to the control signal decoded by decoding circuit 508, and it is output as checking clock signal A1.

Decoding circuit 507 decodes the 4-bit control signal CNT_DT supplied from a control circuit (not shown in the figure) and supplies the decoded signal to selection circuit 505.

Selection circuit 505 selects one delayed signal from 10 delayed signals TP1-TP10 generated by DLL circuit 500 corresponding to the control signal decoded by decoding circuit 507, and it is output as checking clock signal A2.

By using timing control circuit 109 shown in FIG. 5, the phase difference between clock signal CKB7 and checking clock signal A1 can be adjusted with a resolution of 1/10 period corresponding to control signal CNT_CK. Also, the phase difference between clock signal CKB7 and checking clock signal A2 can be adjusted with a resolution of 1/10 period corresponding to control signal CNT_DT.

When the circuit operation is self-checked corresponding to the timing relationship of clock signal CKA_IN and data signal DA_IN, the output signal of flip-flop circuit 304 is input to judging circuit 110 via serial/parallel conversion circuit 305. The judging circuit compares the input signal with the checking pattern signal PAT_A generated by pattern generator 102 and determines whether correct data is held in flip-flop circuit 304 on the basis of the comparison result.

For example, when the timing relationship between checking signals TCKA and TDA is controlled such that the checking signals have a prescribed skew, judging circuit 110 determines whether the data corresponding to checking signals TCKA, TDA held in flip-flop circuit 304 are correct.

In the following, each constituent element of checking circuit 200 will be explained.

In checking circuit 200, checking signal output circuit 201, flip-flop circuits 204, 205, checking signal input circuit 206, timing control circuit 209, and judging circuit 210 correspond to and have the same functions as checking signal output circuit 101, flip-flop circuits 104, 105, checking signal input circuit 106, timing control circuit 109, and judging circuit 110 in checking circuit 100, respectively.

The main difference between checking circuits 200 and 100 is the different input system used as the object to be inspected. In other words, checking circuit 100 checks skew margin Trskm of the input system (referred to as system A' hereinafter) on the side of differential receivers 301, 302 to which clock signal CKA_IN and data signal DA_IN are input. On the other hand, checking circuit 200 checks skew margin Trskm of the input system (referred to as system B' hereinafter) on the side of differential receivers 311, 312 to which clock signal CKB_IN and data signal DB_IN are input.

The clock signals CKB1, CKB7 generated by the PLL circuit 313 in system B' are input to the checking signal output circuit 101 and timing control circuit 109 of checking circuit 100. On the other hand, the clock signals CKA1, CKA7 generated by the PLL circuit 303 in system A' are input to the checking signal output circuit 201 and timing control circuit 209 of checking circuit 200.

In other words, when one of the input systems is being checked, the other input system is used to input clock signals.

Checking signal output circuit 201 outputs clock signal CKA1 (first checking signal) and checking pattern signal PAT_B (second checking signal) synchronously with clock signals CKA1, CKA7 generated by PLL circuit 303.

Checking signal output circuit 201 includes pattern generator 202 and parallel/serial conversion circuit 203 in the example shown in FIG. 1.

Pattern generator 202 sequentially generates 7-bit checking pattern signal used for simulating data signal DB_IN synchronously with clock signal CKA1.

Parallel/serial conversion circuit 203 converts the 7-bit checking pattern signal generated by pattern generator 202 into 1-bit checking pattern signal PAT_B synchronously with clock signal CKA7.

Flip-flop circuit 205 holds the clock signal CKA1 (first checking signal) output from checking signal output circuit 201 synchronously with checking clock signal B1 output from timing control circuit 209.

Flip-flop circuit 204 holds the checking pattern signal PAT_B (second checking signal) output from checking signal output circuit 201 synchronously with checking clock signal B2 output from timing control circuit 209.

When the skew margin Trskm of data signal DB_IN and clock signal CKB_IN is checked, checking signal input circuit 206 converts the checking signal TCKB held in flip-flop circuit 205 into a differential signal and inputs it to differential receiver circuit 312 instead of clock signal CKB_IN. Also, the checking signal TDB held in flip-flop circuit 204 is converted into a differential signal, which is input to differential receiver circuit 311 instead of data signal DB_IN.

Checking signal input circuit 206 includes differential transmitter circuits 207 and 208 in the example shown in FIG. 1. Differential transmitter circuit 207 converts the signal held in flip-flop circuit 205 into a differential signal of LVDS type, etc. and inputs it to differential receiver circuit 312. Differential transmitter circuit 208 converts the signal held in flip-flop circuit 204 into a differential signal of LVDS type, etc. and inputs it to differential receiver circuit 311.

The outputs of differential transmitter circuits 207, 208 can also be set to the in high impedance state during the normal operation without performing a self-check.

Timing control circuit 209 independently controls the timing relationship between clock signal CKA7 and checking clock signal B1 and the timing relationship between clock signal CKA7 and checking clock signal B2 corresponding to the control signal sent from a control circuit (not shown in the figure). Timing control circuit 209 has the same configuration shown in FIG. 5.

When the circuit operation is self-checked corresponding to the timing relationship of clock signal CKB_IN and data signal DB_IN, the output signal of flip-flop circuit 314 is input to judging circuit 210 via serial/parallel conversion circuit 315. The judging circuit compares the input signal with the checking pattern signal PAT_B generated by pattern generator 202 and determines whether correct data is held in flip-flop circuit 314 on the basis of the comparison result.

In the following, the operation of checking skew margin Trskm in the semiconductor integrated circuit in the embodiment having the aforementioned configuration will be explained on the basis of FIGS. 6-8.

FIG. 6 shows the timing relationship of the signal of each part when the skew margin Trskm of system A' is checked.

When system A' is being checked, clock signal CKB_IN for checking is input to differential receiver circuit 312 of system B'. In this way, clock signals CKB1, CKB7 are generated by PLL circuit 313 (FIGS. 6(A), (G).

When clock signal CKB7 is generated, checking clock signals A1, A2 are generated from timing control circuit 109 on the basis of said clock signal (FIGS. 6(C), (D).

When clock signals CKB1, CKB7 are generated, checking pattern signal PAT_A is output from checking signal output circuit 101 synchronously with the clock signals (FIG. 6(B).

Checking pattern signal PAT_A is held in flip-flop circuit 104 synchronously with checking clock signal A2 (FIG. 6(D)). Also, clock signal CKB1 is held in flip-flop circuit 105 synchronously with checking clock signal A1 (FIG. 6(C).

When there is a time difference Td between the rising edges of checking clock signals A1 and A2, there will be a corresponding time difference between the rising edge of checking signal TCKA and the data variation point of checking signal TDA. Also, the same time difference occurs in the differential check signals input to differential receiver circuits 301, 302.

When the time difference is adjusted with timing control circuit 109, the deviation (skew) from the ideal timing shown in FIG. 4(A) can be set arbitrarily. Consequently, when judging part 110 determines whether flip-flop circuit 304 holds the correct data for the set skew, it is able to determine whether the input circuit of system A' has prescribed skew margin Trskm.

The inspection of system A' was explained above. The skew margin Trskm for system B' can be evaluated in the same manner.

Although the skew margin Trskm checked by checking circuits 100, 200 mainly expresses the characteristics related to the setup time and hold time of flip-flop circuits 304, 314, the flip-flop circuits 104, 105, 204, 205 set in the checking circuits also have the same characteristics. In other words, if the signal is held during the period when data changes, an incorrect value may be held, or the operation may become unstable. Consequently, for timing control circuits 109, 209, it is necessary to set the rising edges of checking clock signals A1, A2, B1, B2 appropriately to avoid the period when the input signals of flip-flop circuits 104, 105, 204, 205 have changed.

FIG. 7 shows an example of the case when the flip-flop circuits in the checking circuit hold signals during a period when the signal holding operation is inhibited.

The hatched portion of clock signal CKB1 shown in FIG. 7(A) shows the period when the signal holding operation performed by flip-flop circuit 105 is inhibited. Also, the hatched portion of checking pattern signal PAT_A shown in FIG. 7(B) shows the period when the signal holding operation performed by flip-flop circuit 104 is inhibited.

As shown in FIG. 7(C), since the rising edge occurs for checking clock signal A1 (FIG. 7(C)) in the hatched period, the operation of holding clock signal CKB1 in flip-flop circuit 105 is carried out. As a result, the checking signal TCKA (FIG. 7(E)) held in flip-flop circuit 105 becomes unstable as indicated by the hatched portion.

On the other hand, for the semiconductor memory device disclosed in this embodiment, even if there is a period in which the signal holding operation of the flip-flop circuit is inhibited as described above, the skew of the checking signal can be adjusted over a wide range by independently controlling the phases of the two checking clock signals A1 and A2, B1 and B2 with respect to the clock signals CKB7, CKA7.

FIG. 8 shows an example of avoiding the period in which the signal holding operation of flip-flop circuits 104, 105 is inhibited and of adjusting the skew of checking signals TCAK and TDA over one period during the checking of the input signal of system A'.

FIG. 8(A) shows clock signal CKB1. FIG. 8(B) shows checking pattern signal PAT_A. FIGS. 8(C)-(K) show checking signal TCK in the case of selecting delayed signals TP1-TP9 as checking clock signal A1. FIGS. 8(L)-(T) shows checking signal TDA in the case of selecting delayed signals TP1-TP9 as checking clock signal A2.

In the example shown in FIG. 8, since the rising edges of three delayed signals TP9, TP10, TP1 are superimposed on the period in which signal holding operation is inhibited, these signals cannot be output as checking clock signal A1 or A2 by timing control circuit 109.

When checking clock signal A1 is fixed at delayed signal TP2, even if checking clock signal A2 varies in the range of delayed signals TP2-TP8, the time difference Td between their rising edges is up to "(one period)×6/10". The time difference Td cannot be adjusted over one period.

On the other hand, when both checking clock signals A1 and A2 can be adjusted, if delayed signals T2-T8 is selected appropriately as shown in FIG. 8, time difference Td can be adjusted over one period.

For example, if delayed signal TP2 is used as one of the checking clock signals and the other checking clock signal is selected in the range of delay signals TP2-TP8, time difference Td can be adjusted in the range from zero to "(one period)×6/10". Also, if delayed signal TP5 is used as one of the checking clock signals and the other checking clock signal is selected in the range of delayed signals TP2-TP5, time difference Td can be adjusted in the range from "(one period)× 7/10"to one period.

As explained above, by using the semiconductor integrated circuit disclosed in this embodiment, clock signal CKB1 (CKA1) and checking pattern signal PAT_A (PAT_B) are output from checking signal output circuit 101 (201) synchronously with clock signal CKB7. Clock signal CKB1 (CKA1) is held in flip-flop circuit 105 (205) synchronously with checking clock signal A1 (B1). Checking pattern signal PAT_A (PAT_B) is held in flip-flop circuit 104 (204) synchronously with checking clock signal A2 (B2). Then, when the circuit operation is self-checked corresponding to the timing relationship between clock signal CKA_IN (CKB_IN) and data signal DA_IN (DB_IN), checking signal TCKA (TCKB) held in flip-flop circuit 105 (205) is input to differential receiver circuit 302 (312) instead of clock signal CKA_IN (CKB_IN). Checking signal (TDA) TDB held in flip-flop circuit 104 (204) is input to differential receiver circuit 301 (311) instead of clock signal DA_IN (DB_IN). Also, at that time, the timing relationship between clock signal CKB7 (CKA7) and checking timing signal A1 (B1) and the timing relationship between clock signal CKB7 (CKA7) and checking timing signal A2 (B2) are controlled independently by timing control circuit 109 (209).

When the timing relationship between a plurality of input signals is self-checked with a built-in circuit in a semiconductor integrated circuit as described above, compared with the case of performing a check via signal pins from an external device, the signal path is shortened, and the delay is reduced. Consequently, a highly accurate check can be performed with a simple circuit configuration. Since the circuit elements of a semiconductor integrated circuit used for processing high-speed signals have satisfactory performance that can achieve said operation speed, it is possible to use, for example, a delay-locked loop circuit with a simple configuration to detect very small phase difference accurately.

Also, when high-speed signals are checked inside the semiconductor integrated circuit, it is difficult to influence the measurement system, and the checking accuracy can be increased. In particular, since unstable factors can be eliminated from production lines that handle a large number of products, such as checking boards that handle high-frequency signals or perform sensitive inspections using high-speed LSI testers, the checking stability can be significantly improved.

In addition, when the checking pattern signal is generated and analyzed inside the semiconductor integrated circuit, the test time can be shortened compared with the case of using an external LSI tester.

Moreover, when the generation of high-speed signals and the evaluation of the checking result are performed inside the semiconductor integrated circuit, the inspection equipment can be simplified, and the manufacturing cost can be reduced since there is no need to set up an external high-speed LSI tester.

For the semiconductor integrated circuit disclosed in this embodiment, since the timing relationship between clock signal CKB7 (CKA7) and checking timing signal A1 (B2) and the timing relationship between clock signal CKB7 (CKA7) and checking timing signal A2 (B2) are controlled independently, the timing relationship between checking signal TCKA (TCKB) and checking signal TDA (TDB) can be adjusted over a wider range compared with the case of fixing one of the timing relationships.

When high-speed signals are processed, the inspection will be easily affected by the setup/hold characteristics of flip-flop 304 (314), the delay of differential receivers 301, 302 (311, 312), and changes in other circuit characteristics. When the adjustment range is expanded as described in this embodiment, even high-speed signals can be checked reliably.

In addition, the semiconductor integrated circuit disclosed in this embodiment has a plurality of checking circuits that check the input circuits of a plurality of systems. When one of the plurality of systems is being checked, the input circuit of another system is used to input the clock signal for checking. Consequently, compared with the case of using dedicated input pins for checking, the number of pins can be reduced, and the package size can be miniaturized.

In the following, another configuration example of this embodiment will be explained on the basis of FIG. 9.

In the aforementioned embodiment, the timing relationship between checking signal TCKA (TCKB) and checking signal TDA (TDB) is controlled by selecting one delayed signal from a plurality of delayed signals in timing control circuit 109 (209). In this case, if the number of delayed signals that can be selected is small, it may not be able to make an adjustment to the optimum checking point.

Figure 9A:
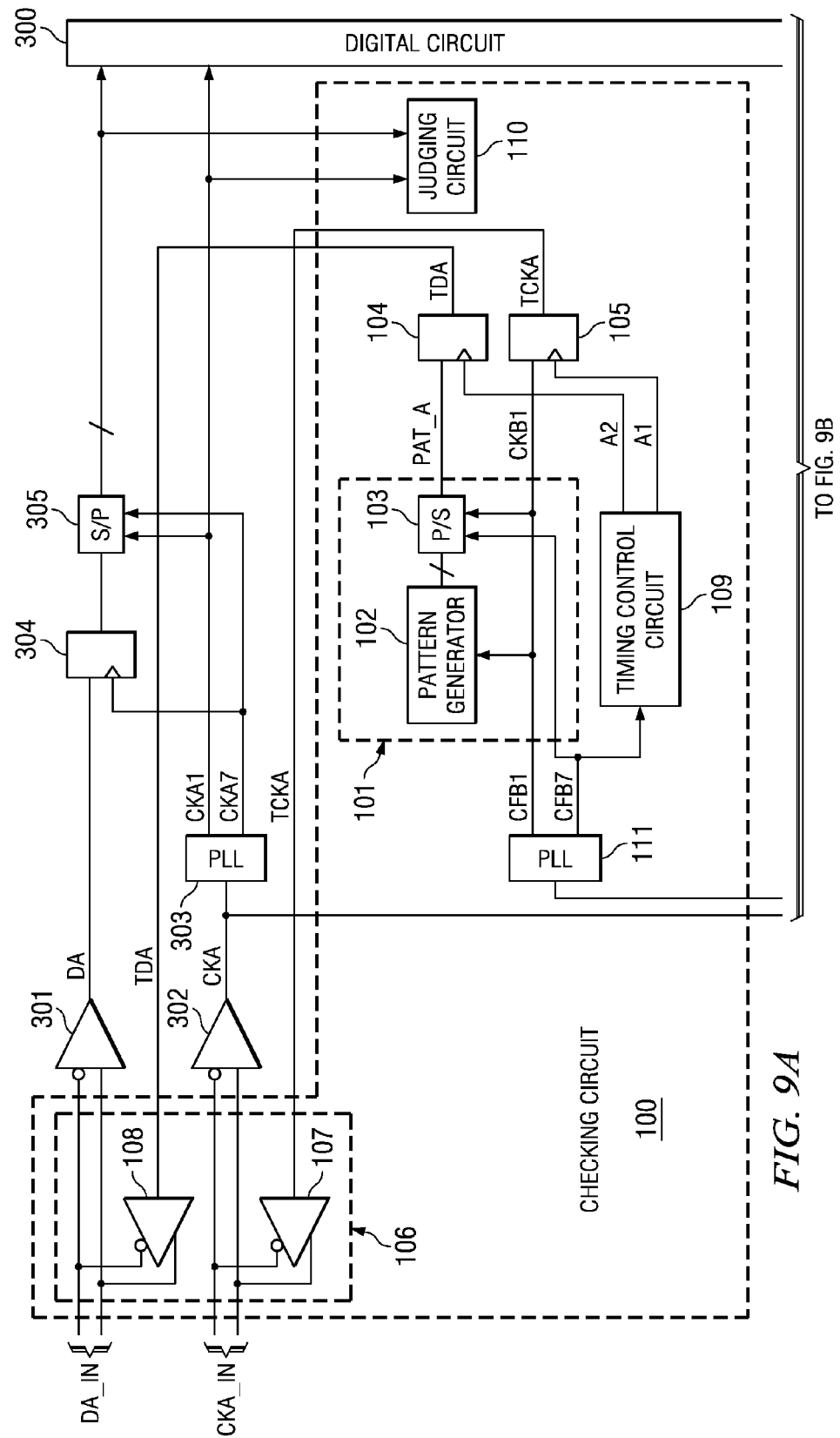
FIGS. 9A and 9B show another configuration example of the semiconductor integrated circuit disclosed in this embodiment.
Figure 9B:
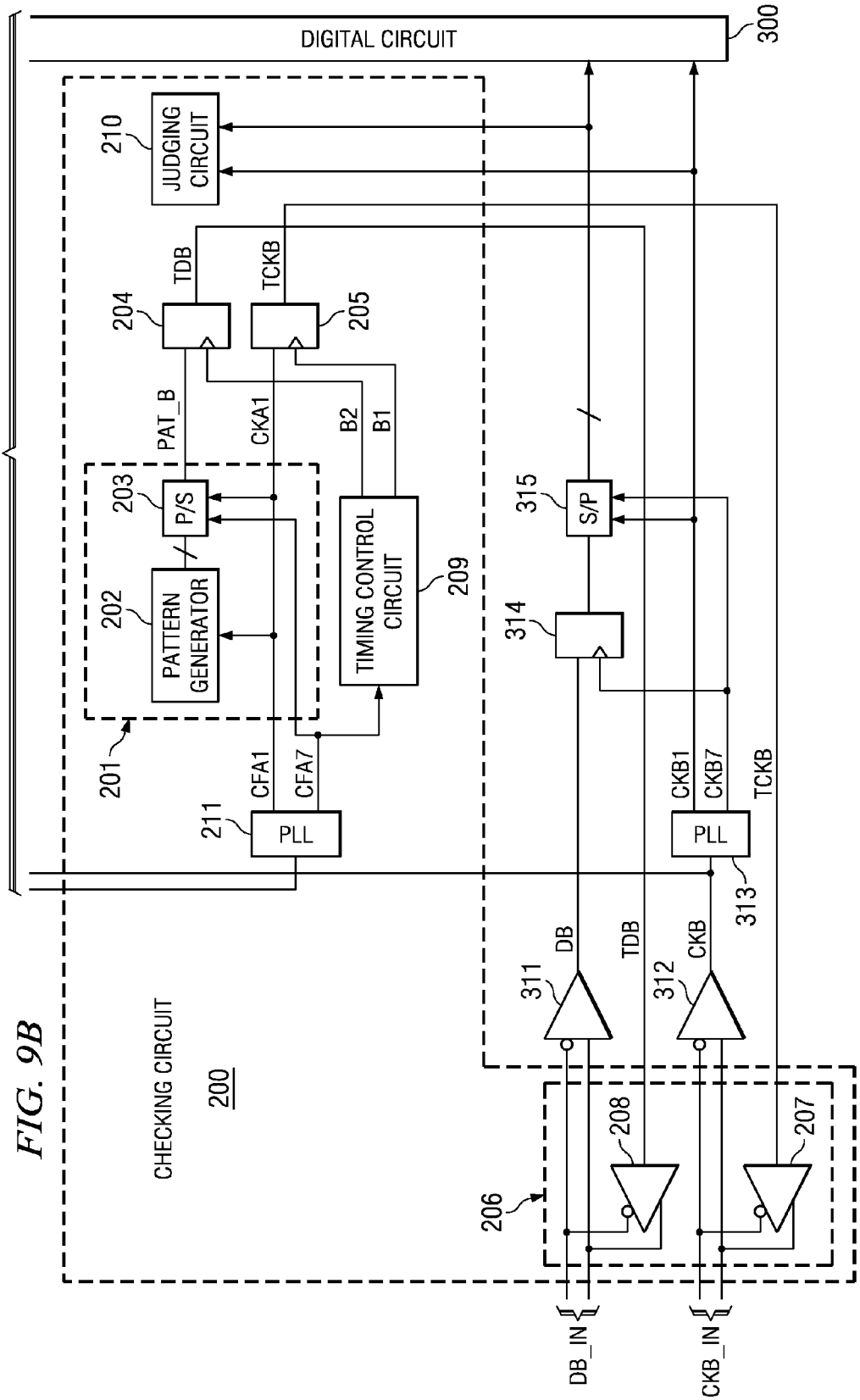

For example, as shown in FIG. 9, the clock signals supplied to checking signal output circuit 101 and timing control circuit 109 can also be adjusted using PLL circuit or another circuit capable of frequency control.

The semiconductor integrated circuit shown in FIG. 9 has the same configuration as the semiconductor integrated circuit shown in FIG. 1, as well as PLL circuits 111 and 211. PLL circuit 111 is included in checking circuit 100, and PLL circuit 211 is included in checking circuit 200.

PLL circuit 111 outputs clock signals CFB1 and CFB7 synchronously with clock signal CKB output from differential receiver circuit 312. PLL circuit 111 adjusts the frequency of clock signal CFB1 corresponding to the control signal and sets the frequency of clock signal CFB7 to 7 times the frequency of clock signal CFB1.

Instead of clock signals CKB1, CKB7 generated by PLL circuit 313, clock signals CFB1, CFB7 generated by PLL circuit 111 are input to checking signal output circuit 101 and timing control circuit 109.

PLL circuit 211 outputs clock signals CFA1 and CFA7 synchronously with clock signal CKA output from differential receiver circuit 302. PLL circuit 211 adjusts the frequency of clock signal CFA1 corresponding to the control signal and sets the frequency of clock signal CFA7 to 7 times the frequency of clock signal CFA1.

Instead of clock signals CKA1, CKA7 generated by PLL circuit 303, clock signals CFB1, CFB7 generated by PLL circuit 211 are input to checking signal output circuit 201 and timing control circuit 209.

FIG. 10 shows an example of the configuration of PLL circuits 111, 211.

The PLL circuits 111, 211 shown in FIG. 10 comprise phase comparing circuit 601, charge-pump circuit 602, filter circuit 603, voltage-controlled oscillator 604, programmable frequency-dividing circuit 605, and frequency-dividing circuit 606.

In FIG. 10, symbols representing the input/output signals of PLL circuit 211 are added in parentheses after the symbols representing the input/output signals of PLL circuit 111.

Phase comparing circuit 601, charge-pump circuit 602, filter circuit 603, and voltage-controlled oscillator 604 have the same functions and operate in the same way as phase comparing circuit 401, charge-pump circuit 402, filter circuit 403, and voltage-controlled oscillator 404 shown in FIG. 2, respectively.

However, clock signal CKB (CKA) and the signal whose frequency is divided by programmable frequency-dividing circuit 605 are input to phase comparing circuit 601, which compares the phases of two input signals.

Programmable frequency-dividing circuit 605 sets the overall frequency-dividing ratio corresponding to control signal CNT_F, divides the frequency of the oscillated signal output from voltage-controlled oscillator 604 by the set frequency-dividing ratio, and feeds back the signal to phase comparing circuit 601.

Frequency-dividing circuit 606 divides the frequency of the oscillated signal output from voltage-controlled oscillator 604 to $\frac{1}{7}$. The input signal of frequency-dividing circuit 606 is clock signal CFB7 (CFA7), and the output signal is clock signal CFB1 (CFA1).

By using PLL circuit 111 (211) shown in FIG. 10, since negative feedback control is performed such that the output signal of programmable frequency-dividing circuit 605 is in phase with clock signal CKB (CKA), the frequency of clock signal CFB7 (CFA7) input to frequency-dividing circuit 606 becomes approximately equal to the product of the frequency-dividing ratio set by programmable frequency-dividing circuit 605 and the frequency of clock signal CKB (CKA). Also, the frequency of clock signal CFB1 (CFA1) becomes 1/7 the frequency of clock signal CFB7 (CFA7).

Consequently, when the frequency-dividing ratio of programmable frequency-dividing circuit 605 is controlled corresponding to control signal CNT_F, the frequencies of clock signal CFB7 (CFA7) and clock signal CFB1 (CFA1) can be controlled, and this frequency ratio can be fixed to 7:1.

FIG. 11 is a diagram explaining an example that can appropriately set the checking threshold value by changing the frequency of clock signal CFB7.

FIG. 11(A) shows checking signal TDA with optimum timing in the case when clock signal CFB7 (FIG. 11(F)) is set to frequency fm. The deviation from the optimum timing is adjusted stepwise by selecting delayed signal from TAP1, ..., TAP10' as checking clock signal A2 output from timing control circuit 109. FIGS. 11(B), (C), (D) show checking signal TDA in the case when delayed signals TAPn, TAPn+1, TAPn+2 are selected as checking clock signal A2. n' is an integer in the range of 1-8.

For skew margin Trskm, as shown in FIG. 11, there is an average actually measured value obtained by actual measurement and a value specified in specification. When it is checked to see whether a semiconductor integrated circuit used as the object to be inspected has skew margin Trskm specified in the specification, a skew of checking signal TDA between the specification value and the actually measured value of skew margin Trskm is set, and judging circuit 110 determines whether the circuit operates normally in that state. Abnormal circuit operation means that the specification value of skew margin Trskm has not been met.

In the example shown in FIG. 11, however, if clock signal CFB7 has a frequency fm, when the skew of checking signal TDA between the specification value and the actually measured value of skew margin Trskm is set, the skew of checking signal TDA becomes very close to the specification value of skew margin Trskm (FIG. 11(D)). In FIG. 11, the time difference between the skew of checking signal TDA that can be set and the actually measured value of skew margin Trskm is represented by Ta', and the time difference between the skew that can be set and the specification value of skew margin Trskm is represented by Tb'. Ideally, when Tb=Ta', it becomes Tb<Ta' in FIG. 11(D). In this case, the semiconductor integrated circuit with low quality that just satisfies the specification value passes the test.

In this case, when checking is performed with the frequency of clock signal CFB7 of PLL circuit 111 reduced from fn' to fs', as shown in FIG. 11(J), time difference Tb' and Ta' are almost equal to each other.

If the semiconductor integrated circuit is checked with the skew margin of checking signal TDA set to an appropriate value as described above, the trade-off between yield and the problem rate can be appropriately balanced, and the productivity can be improved.

Several embodiments of the present invention were explained above. The present invention, however, is not limited to these embodiments, but may include various modifications.

In the aforementioned embodiments, the circuit operation corresponding to the timing relationship between one clock signal and one data signal is checked. However, the present invention is not limited to this. The present invention can also be applied to a circuit that receives several data signals synchronously with one clock signal as inputs.

The number of checking circuits is not limited to two as described in the aforementioned examples. For example, if the input circuits of a plurality of systems are included in a semiconductor integrated circuit, it is possible to use one checking circuit for each system.

In the example shown in FIG. 9, PLL circuits 111 and 211 used as frequency control circuits are formed inside the semiconductor integrated circuit. It is also possible to arrange them on the side of the checking device. In other words, when checking the semiconductor integrated circuit shown in FIG. 1, it is also possible to control the frequency of the clock signal for checking input to the semiconductor integrated circuit in the checking device of the generation source of that clock signal.

While the invention has been particularly shown and described with reference to preferred embodiments thereof it is well understood by those skilled in the art that various changes and modifications can be made in the invention without departing from the spirit and scope of the invention as defined by the appended claims.

The invention claimed is:

1. A semiconductor integrated circuit having a checking circuit that can self-check the circuit operation corresponding to the timing relationship between a first input signal and at least one second input signal, comprising:
   a checking signal output circuit that outputs a first checking signal and a second checking signal synchronously with an input clock signal;
   a first flip-flop circuit that holds the first checking signal synchronously with a first checking clock signal;
   a second flip-flop circuit that holds the second checking signal synchronously with a second checking clock signal;
   a checking signal input circuit that inputs the checking signal held in the first flip-flop circuit instead of the first input signal and the checking signal held in the second flip-flop circuit instead of the second input signal when performing the self-checking; and
   a timing control circuit that controls the timing relationship between the first checking clock signal and the input clock signal corresponding to a first control signal and the timing relationship between the second checking clock signal and the input clock signal corresponding to a second control signal.

2. The semiconductor integrated circuit described in claim 1 wherein
   the semiconductor integrated circuit comprises a plurality of checking circuits, and
   when the self-checking is performed in one checking circuit, the first input signal as the object to be inspected in another checking circuit or a signal synchronized with the input signal is supplied as the input clock signal to the one checking circuit.

3. The semiconductor integrated circuit described in claim 2 wherein the semiconductor integrated circuit comprises a plurality of phase-locked loop circuits; and further comprising:
   a phase-locked loop circuit generating a first clock signal synchronously with the first input signal as the object to be inspected in the corresponding checking circuit and a second clock signal that multiples the frequency of the first clock signal;

when said self-checking is performed in one checking circuit the checking signal output circuit included in said one checking circuit outputs the first and second checking signals synchronously with the first clock signal generated in the phase-locked loop circuit corresponding to another checking circuit; and the timing control circuit included in the one checking circuit outputs the second clock signal generated in the phase-locked loop circuit corresponding to the another checking circuit as the first checking clock signal and delays the second clock signal corresponding to the second control signal and then outputs it as the second checking clock signal.

4. The semiconductor integrated circuit described in claim 3 wherein the timing control circuit comprises:
   a delay synchronization loop circuit that outputs a plurality of delay signals, each of which has a prescribed phase difference with respect to the second clock signal;
   a first selection circuit that outputs a delay signal selected corresponding to the first control signal from the plurality of delay signals as the first checking clock signal;
   a second selection circuit that outputs a delay signal selected corresponding to the second control signal from the plurality of delay signals as the second checking clock signal.

5. The semiconductor integrated circuit described in claim 4 wherein the checking circuit comprises a frequency control circuit that controls the frequency of the input clock signal corresponding to a control signal.

6. The semiconductor integrated circuit described in claim 2 further comprising:
   a circuit block that outputs a signal corresponding to the first and second input signals;
   a judging circuit that determines whether the operation of the circuit block is normal on the basis of the output signal of the circuit block corresponding to the checking signal input by the checking signal input circuit instead of the first and second input signals.

7. The semiconductor integrated circuit described in claim 2 wherein the checking circuit comprises a frequency control circuit that controls the frequency of the input clock signal corresponding to a control signal.

8. The semiconductor integrated circuit described in claim 3 further comprising:
   a circuit block that outputs a signal corresponding to the first and second input signals;
   a judging circuit that determines whether the operation of the circuit block is normal on the basis of the output signal of the circuit block corresponding to the checking signal input by the checking signal input circuit instead of the first and second input signals.

9. The semiconductor integrated circuit described in claim 3 wherein the checking circuit comprises a frequency control circuit that controls the frequency of the input clock signal corresponding to a control signal.

10. The semiconductor integrated circuit described in claim 4 further comprising:
    a circuit block that outputs a signal corresponding to the first and second input signals;
    a judging circuit that determines whether the operation of the circuit block is normal on the basis of the output signal of the circuit block corresponding to the checking signal input by the checking signal input circuit instead of the first and second input signals.

11. The semiconductor integrated circuit described in claim 1 wherein the checking circuit comprises a frequency control circuit that controls the frequency of the input clock signal corresponding to a control signal.

12. The semiconductor integrated circuit described in claim 11 further comprising:
    a circuit block that outputs a signal corresponding to the first and second input signals;
    a judging circuit that determines whether the operation of the circuit block is normal on the basis of the output signal of the circuit block corresponding to the checking signal input by the checking signal input circuit instead of the first and second input signals.

13. The semiconductor integrated circuit described in claim 1 further comprising:
    a circuit block that outputs a signal corresponding to the first and second input signals;
    a judging circuit that determines whether the operation of the circuit block is normal on the basis of the output signal of the circuit block corresponding to the checking signal input by the checking signal input circuit instead of the first and second input signals.

14. A semiconductor integrated circuit comprising:
    a first memory circuit that inputs and outputs a first data signal corresponding to a first clock signal,
    a second memory circuit that inputs and outputs a second data signal corresponding to a second clock signal;
    a first test signal generating circuit that generates first and second test signals corresponding to the second clock signal,
    a first timing signal generating circuit that generates first and second timing signals corresponding to the clock signal;
    a third memory circuit that inputs a first test signal corresponding to the first timing signal and outputs it as a first test data signal;
    a fourth memory circuit that inputs a second test signal corresponding to the second timing signal and outputs it as a first test clock signal;
    a second test signal generating circuit that generates third and fourth test signals corresponding to the first clock signal;
    a second timing signal generating circuit that generates third and fourth timing signals corresponding to the first clock signal;
    a fifth memory circuit that inputs the third test signal corresponding to the third timing signal and outputs it as a second test data signal;
    a sixth memory circuit that inputs the fourth test signal corresponding to the fourth timing signal and outputs it as a second test clock signal;
    a first test signal input circuit that supplies the first test data signal to the first memory circuit;
    a second test signal input circuit that supplies the first test clock signal to the first memory circuit;
    a third test signal input circuit that supplies the second test data signal to the second memory circuit;
    a fourth test signal input circuit that supplies the second test clock signal to the second memory circuit; and
    wherein the first memory circuit is tested on the basis of the second clock signal, and the second memory circuit is tested on the basis of the first clock signal.

15. The semiconductor integrated circuit described in claim 14 further comprising:
    a first input circuit that inputs a first external data signal and outputs it as the first data signal;
    a second input circuit that inputs a first external clock signal;

a first PLL circuit that is electrically connected to the second input circuit and outputs a third clock signal with the same frequency as the first external clock signal and the first clock signal having a higher frequency than the third clock signal;

a third input circuit that inputs a second external data signal and outputs it as the second data signal;

a fourth input circuit that inputs a second external clock signal;

a second PLL circuit that is electrically connected to the fourth input circuit and outputs a fourth clock signal having the same frequency as the second external clock signal and the second clock signal having higher frequency than the fourth clock signal; and wherein the second test signal is the fourth clock signal, and the fourth test signal is the third clock signal.

16. The semiconductor integrated circuit described in claim 15 wherein the first test signal generating circuit has a first pattern generating circuit used for generating test data, and the second test signal generating circuit has a second pattern generating circuit used for generating test data.

17. The semiconductor integrated circuit described in claim 16 wherein the first and second timing signals have different phases, and the third and fourth timing signals have different phases.

18. The semiconductor integrated circuit described in claim 15 wherein the first and second timing signals have different phases, and the third and fourth timing signals have different phases.

19. The semiconductor integrated circuit described in claim 14 wherein the first and second timing signals have different phases, and the third and fourth timing signals have different phases.

* * * * *

UNITED STATES PATENT AND TRADEMARK OFFICE
CERTIFICATE OF CORRECTION

| | | |
|---|---|---|
| PATENT NO. | : 7,730,374 B2 | Page 1 of 1 |
| APPLICATION NO. | : 11/555524 | |
| DATED | : June 1, 2010 | |
| INVENTOR(S) | : Masahiro Fusumada et al. | |

It is certified that error appears in the above-identified patent and that said Letters Patent is hereby corrected as shown below:

On the title page item (75), should read:

"Massahiro Fusumada" to --Masahiro Fusumada.--

Signed and Sealed this

Twenty-fourth Day of August, 2010

David J. Kappos
*Director of the United States Patent and Trademark Office*